US011581243B2

(12) United States Patent
Hinton et al.

(10) Patent No.: US 11,581,243 B2
(45) Date of Patent: Feb. 14, 2023

(54) CPU COOLING SYSTEM WITH DIRECT SPRAY COOLING

(71) Applicant: HYPERTECHNOLOGIE CIARA INC., Saint-Laurent (CA)

(72) Inventors: Michael Hinton, Montreal (CA); Laurent Mydlarski, Dollard-des-Ormeaux (CA)

(73) Assignee: HYPERTECHNOLOGIE CIARA INC., Saint-Laurent (CA)

( * ) Notice: Subject to any disclaimer, the term of this patent is extended or adjusted under 35 U.S.C. 154(b) by 388 days.

(21) Appl. No.: 16/099,049

(22) PCT Filed: May 11, 2017

(86) PCT No.: PCT/CA2017/050568
§ 371 (c)(1),
(2) Date: Nov. 5, 2018

(87) PCT Pub. No.: WO2017/193216
PCT Pub. Date: Nov. 16, 2017

(65) Prior Publication Data
US 2020/0105645 A1     Apr. 2, 2020

Related U.S. Application Data

(60) Provisional application No. 62/334,480, filed on May 11, 2016.

(51) Int. Cl.
*H01L 23/473* (2006.01)
*H01L 23/40* (2006.01)
(Continued)

(52) U.S. Cl.
CPC ...... *H01L 23/4735* (2013.01); *H01L 23/4006* (2013.01); *H05K 7/20345* (2013.01); *G06F 1/20* (2013.01); *H05K 7/20772* (2013.01)

(58) Field of Classification Search
CPC .... H01L 23/473–4735; H01L 23/4087; H05K 7/208; H05K 7/20218;
(Continued)

(56) References Cited

U.S. PATENT DOCUMENTS 3,818,983 A     6/1974  Grandia
5,761,035 A     6/1998  Beise
(Continued)

FOREIGN PATENT DOCUMENTS

CN     100347636     11/2007
CN     101115375     1/2008
(Continued)

OTHER PUBLICATIONS

Coralie, Gill, Interational Search Report PCT/CA2017/050568. Form PCT/ISA/210. dated Jun. 29, 2017, 3 pages.

*Primary Examiner* — Zachary Pape
*Assistant Examiner* — Amir A Jalali
(74) *Attorney, Agent, or Firm* — Benoit & Cote Inc.; Charles-Andre Caron

(57) ABSTRACT

There is described a spray chamber for cooling a computer processor on a circuit board. The spray chamber comprises: a wall assembly for sealable mounting on an exposed cooling surface of the computer processor defining an enclosure having a top opening and a bottom opening which opens on the top surface of the computer processor; and a lid for covering the top opening of the wall assembly in a sealable manner, the lid having a nozzle which sprays coolant that impinges on the exposed cooling surface of the computer processor.

13 Claims, 2 Drawing Sheets

(51) Int. Cl.
*H05K 7/20* (2006.01)
*G06F 1/20* (2006.01)

(58) Field of Classification Search
CPC .......... H05K 7/20272; H05K 7/20254; H05K 7/20309–20327; H05K 7/205; H05K 7/20627–20645; H05K 7/20663–20781; H05K 7/20763; H05K 7/20872–20881; H05K 7/20927–20936
See application file for complete search history.

(56) References Cited

U.S. PATENT DOCUMENTS

| | | | |
|---|---|---|---|
| 6,108,201 A | 8/2000 | Tilton | |
| 6,205,799 B1 | 3/2001 | Patel et al. | |
| 6,550,263 B2 | 4/2003 | Patel et al. | |
| 6,625,023 B1 | 9/2003 | Morrow et al. | |
| 6,646,879 B2 | 11/2003 | Pautsch | |
| 6,708,515 B2 | 3/2004 | Malone et al. | |
| 6,996,996 B1 * | 2/2006 | Tahir | F25D 17/02 62/118 |
| 7,506,519 B1 | 5/2009 | Tilton et al. | |
| 7,527,085 B2 | 5/2009 | Iijima et al. | |
| 7,713,421 B2 | 5/2010 | Galbraith | |
| 7,992,626 B1 | 8/2011 | Tilton et al. | |
| 2003/0172669 A1 | 9/2003 | Tilton et al. | |
| 2005/0248921 A1 * | 11/2005 | Schmidt | H01L 23/473 361/698 |
| 2006/0126296 A1 * | 6/2006 | Campbell | H05K 7/20781 361/700 |
| 2006/0278372 A1 * | 12/2006 | Lai | F28F 3/12 165/104.33 |
| 2007/0274045 A1 * | 11/2007 | Campbell | F28F 7/00 361/699 |
| 2008/0037221 A1 | 2/2008 | Campbell | |
| 2008/0123297 A1 | 5/2008 | Tilton et al. | |
| 2008/0264604 A1 * | 10/2008 | Campbell | F28F 3/12 165/80.4 |
| 2009/0030559 A1 * | 1/2009 | Sharma | G05D 23/1928 700/300 |
| 2009/0266516 A1 | 10/2009 | Jewell-Larsen et al. | |
| 2012/0026745 A1 * | 2/2012 | Cheng | F21V 29/51 362/373 |
| 2014/0204532 A1 * | 7/2014 | Mehring | H05K 7/20345 361/689 |
| 2016/0037680 A1 * | 2/2016 | Hou | H05K 7/20345 361/699 |
| 2017/0245394 A1 * | 8/2017 | Matte | H01L 23/473 |

FOREIGN PATENT DOCUMENTS

| | | | |
|---|---|---|---|
| CN | 101115378 | 1/2008 | |
| CN | 101115373 | 8/2010 | |
| CN | 101115376 | 9/2011 | |
| CN | 101677091 | 12/2011 | |
| EP | 2239646 | 10/2010 | |
| EP | 3188230 A * | 5/2017 | ............ H01I 23/473 |
| JP | H06334080 | 12/1994 | |
| JP | 2010072993 | 4/2010 | |
| JP | 2010079397 A | 4/2010 | |
| JP | 2010079401 | 4/2010 | |
| JP | 2010079402 | 4/2010 | |
| JP | 2010079403 | 4/2010 | |
| JP | 2010080507 | 4/2010 | |
| JP | 2015146189 | 8/2015 | |
| KR | 1020030020193 | 3/2003 | |
| KR | 100488104 | 4/2005 | |
| KR | 2020100003923 | 4/2010 | |
| WO | 2009117796 | 10/2009 | |

* cited by examiner

CPU COOLING SYSTEM WITH DIRECT SPRAY COOLING

BACKGROUND

(a) Field

The subject matter disclosed generally relates to cooling systems for electronics. More specifically, it relates to spray cooling devices for processors.

(b) Related Prior Art

There are various types of cooling devices for computer components. Existing devices usually rely on the presence of a cold plate to extract heat from the central processing unit (CPU) by conduction. A layer of thermal interface material is provided to ensure proper heat conduction from the CPU to the cold plate. The cold plate can then transfer its heat to another medium, which can be a fluid that flows on the cold plate.

This process can be inefficient given the number of intermediaries that are required to transport heat from the CPU to the outside.

Document U.S. Pat. No. 6,646,879 describes a device to directly spray a coolant on various electronic components of a circuit board (aka a motherboard) inside a spraying chamber. As will be described below, it has been found that existing devices that spray a coolant on electronic components suffer from various drawbacks.

SUMMARY

According to an embodiment, there is provided a spray chamber for cooling a computer processor on a circuit board, the spray chamber comprising:
- a wall assembly for sealable mounting on an exposed cooling surface of the computer processor defining an enclosure having a top opening and a bottom opening which opens on the exposed cooling surface of the computer processor; and
- a lid for covering the top opening of the wall assembly in a sealable manner, the lid having a nozzle which sprays coolant that impinges on the exposed cooling surface of the computer processor.

According to an aspect, the spray chamber further comprises a board fastening system adapted to fasten to the circuit board and to form a hermetic seal between the spray chamber and the exposed cooling surface of the computer processor.

According to an aspect, the board fastening system comprises mounting arms that are compatible with a standard heatsink mounting mechanism of the circuit board.

According to an aspect, the heatsink mounting mechanism comprises a standardized screw hole pattern which is a part of the Independent Loading Mechanism (ILM) thereby the mounting arms are compatible with the ILM.

According to an aspect, the circuit board comprises a computer processor socket that comprises the ILM.

According to an aspect, the spray chamber further comprises a lid fastening system adapted to fasten and to form a hermetic seal between the wall assembly and the lid.

According to an aspect, the nozzle comprises more than one nozzle arranged according to an array pattern.

According to an aspect, the spray chamber further comprises further comprising an inlet adapted to receive the coolant and a chamber outlet adapted to allow outflow of coolant from the spray chamber.

According to an aspect, the inlet and the outlet are located in the lid.

According to an aspect, the outlet is located in the wall assembly.

According to an aspect, the lid and the wall assembly are made from a single block that forms the spray chamber.

According to an embodiment, there is provided a cooling system for cooling a computer processor on a circuit board, the cooling system comprising:
- a pump for pumping a coolant;
- a heat rejection unit where the coolant can release heat;
- a spray chamber defining an enclosure for enclosing an exposed cooling surface of the computer processor; and
- coolant-circulation assembly for transporting the coolant through the pump, the spray chamber and the heat rejection unit; and According to an aspect, the spray chamber is adapted for spraying coolant on the exposed cooling surface of the computer processor.

According to an aspect, the coolant-circulation assembly, the pump, the spray chamber and the heat rejection unit form a closed-loop for transporting the coolant.

According to an aspect, the cooling system further comprises a reservoir for holding coolant, the reservoir being integrated in the closed-loop.

According to an aspect, the spray chamber comprises:
- a wall assembly for sealable mounting on an exposed cooling surface of the computer processor defining an enclosure having a top opening and a bottom opening which opens on the exposed cooling surface of the computer processor; and
- a lid for covering the top opening of the wall assembly in a sealable manner, the lid having a nozzle which sprays the coolant that impinges on the exposed cooling surface of the computer processor.

According to an aspect, the lid further comprises a lid reservoir where coolant is accumulated and pressurized by the pump.

According to an aspect, the cooling system further comprises a board fastening system adapted to fasten to the circuit board and to form a hermetic seal between the spray chamber and the exposed cooling surface of the computer processor.

According to an aspect of the invention, there is provided a spray chamber for cooling a CPU. The spray chamber comprises: a wall assembly for sealable mounting on an exposed cooling surface of the CPU defining an enclosure having a top opening and a bottom opening which opens on the exposed cooling surface of the CPU; and a lid for covering the top opening of the wall assembly in a sealable manner, the lid having at least one nozzle which sprays coolant that impinges on the exposed cooling surface of the CPU.

The exposed cooling surface of the CPU refers to the surface on the CPU where the cold plate or heat sink would normally be applied. Usually, this surface is the IHS (integrated heat spreader) of the CPU.

According to another aspect of the invention, there is provided a cooling system for cooling a CPU in a standard CPU socket, the cooling system comprising: a pump for pumping a coolant; a heat rejection unit where the coolant can release heat; a spray chamber comprising walls and a lid defining an enclosure with a bottom opening for enclosing an exposed cooling surface of the CPU; tubing for transporting the coolant from the pump to the spray chamber, to the heat rejection unit and back to the pump.

BRIEF DESCRIPTION OF THE DRAWINGS

Further features and advantages of the present disclosure will become apparent from the following detailed description, taken in combination with the appended drawings, in which.

DETAILED DESCRIPTION

The document U.S. Pat. No. 6,646,879 mentioned above suffers from various drawbacks. The spraying chamber described therein is designed to spray coolant on a plurality of electronic components at the same time. The flow of coolant is not optimized for each electronic component, thereby reducing efficiency and potentially not achieving ideal heat transfer.

Moreover, the device described in document U.S. Pat. No. 6,646,879 uses spray chambers that encompass more than just the heated surface, and has a specially designed circuit board and specially designed sockets for installing the spray chambers and remainder of the device. All of this increases the overall cost of the device, makes its installation more complex and requires substantial modification of the circuit board or a circuit board specifically designed to support the device. Cleaning, maintaining and removal of the device is also complicated.

There will be described below a cooling system that can be mounted on an existing circuit board, CPU socket and CPU, or on a standard circuit board, CPU socket and CPU without requiring modifications to the circuit board, CPU socket or CPU. The cooling system described below can also have its flow adapted for optimal heat removal of a single CPU. The spray chamber of the cooling system has also been designed for ease of customization, maintenance and cleaning. Finally, the cooling system comprises a spray chamber that is specifically designed to be installed in a hermetically sealed fashion along the perimeter of the exposed cooling surface of a CPU and to use the standard fastening mechanisms of the CPU socket; additional electrical insulation or hermetic seals are not required to protect any other components of the computer system because the coolant is sealed between the exposed cooling surface of the CPU and the remainder of the closed-loop cooling system, thereby making the cooling system very practical.

It should be noted that the presently described device and system is capable of both single-phase (liquid) and two-phase (liquid and vapor) spray cooling. The spray cooling cases therefore cover embodiments where either none of the coolant is vaporizing or only a portion of the coolant is being vaporized.

Figure 1:
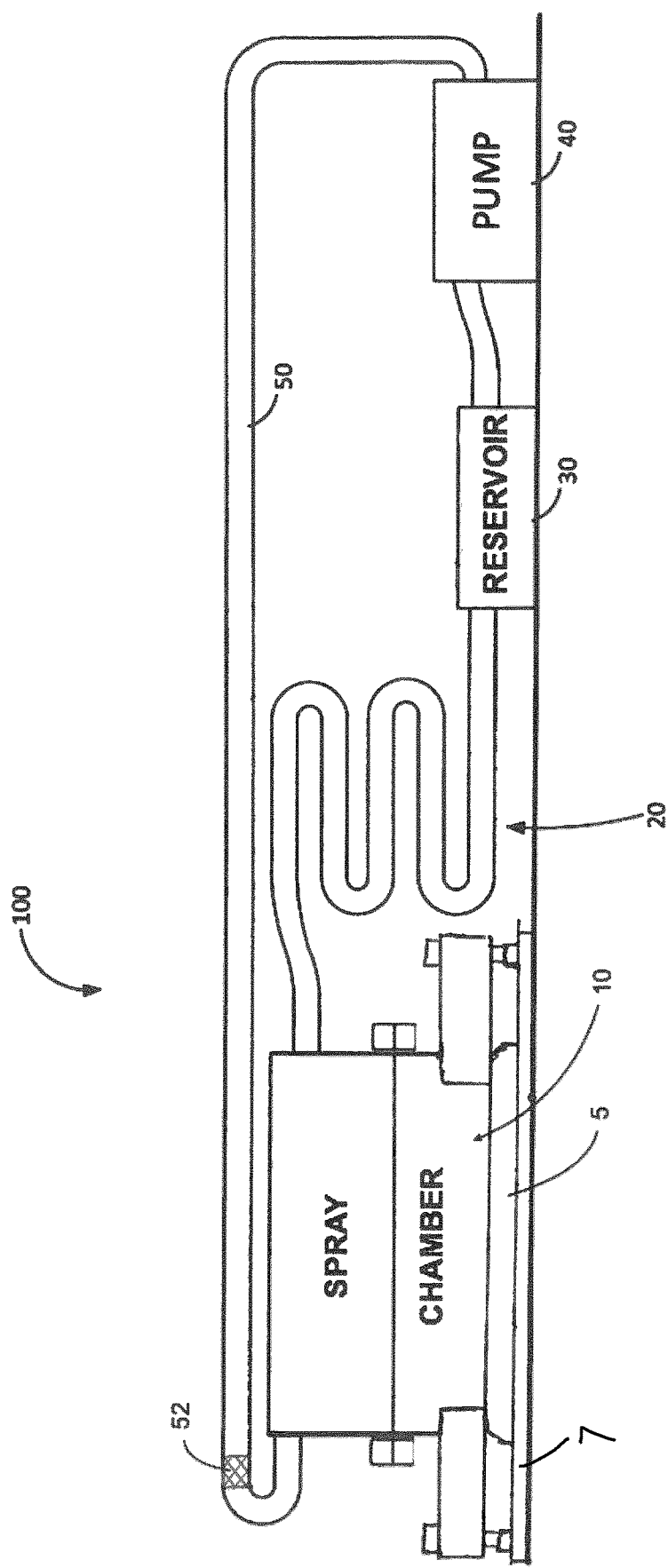
FIG. 1 is a side view of the spray cooling system comprising a spray chamber, according to an embodiment.

Referring to FIG. 1, there is shown a cooling system 100. The cooling system 100 comprises a spray chamber 10, which is mounted directly on a CPU 5 (central processing unit). It should be understood that the "CPU" also encompasses specific varieties of processing units, such as a GPU (graphical processing unit). It should also be understood that "CPU" encompasses any kind of computer processor, microprocessor, etc. on computer chip.

The spray chamber 10 is mounted on the exposed cooling surface of a single CPU 5 only. This is useful to adjust the flow of coolant that will pass therethrough. Although, another embodiment could include a single system with multiple spray chambers, each spray cooling individual processors in parallel, or, in some cases, in series.

As described further below, the spray chamber 10 is a two-part device that contains a hollow chamber therein for putting a coolant into direct contact with the exposed cooling surface of the CPU 5 without having to modify the CPU or install additional protection against wetting.

The coolant should be carefully selected, since the coolant must be compatible with direct contact with the exposed cooling surface of the CPU 5. Most notably, according to an embodiment, the coolant is electrically-insulating if there are any exposed electrical connections on the exposed cooling surface of the CPU 5. Any coolant with favorable heat transfer properties is suitable for the system. In a two-phase spray cooling embodiment, a coolant with a saturation temperature lower than maximum allowable spray surface temperature would be suitable. In a single-phase spray cooling embodiment, a coolant with a higher saturation temperature would be preferable.

Providing direct contact between the coolant and the exposed cooling surface of the CPU 5 provides for very efficient heat removal, since the cold plate and thermal interface material, usually required in existing CPU cooling devices, do not need to be provided in the cooling system 100 described herein.

This coolant flows in a coolant-circulation assembly 50, made of tubing, hoses or anything similar that can transport coolant. The coolant-circulation assembly 50 is shown in FIG. 1. According to an embodiment, the coolant-circulation assembly 50, together with the other components of the cooling system 100, forms a closed-loop through which the coolant circulates to act upon the CPU 5 inside the spray chamber 10. A closed loop is preferable because it requires a lesser quantity of coolant and keeps the system sealed.

In an embodiment, a filter 52 is provided in the cooling system 100 to prevent the spray nozzles 17 from becoming blocked by debris in the system. The filter 52 would typically be placed just prior to the spray nozzles 17 (or the lid inlet 13 of the spray chamber 10).

In another embodiment, some aspects of the cooling loop, such as the heat rejection, are handled outside of the computer. In such an embodiment, the cooling loop would not necessarily have to be closed.

A pump 40 is provided at some location in the loop to provide the mechanical energy that is required to have the coolant flow and make the cooling system 100 work.

A reservoir 30 is further provided to store coolant therein and to ensure that there is a sufficient quantity of coolant inside the cooling system 100. Coolant can be replaced or inserted through this reservoir 30. If sufficient volume exists in the fluid loop of the system, a dedicated coolant reservoir may not be necessary.

As described further below, the coolant is expected to evaporate in the spray chamber 10 during two-phase cooling. However, the coolant preferably flows in the pump and the coolant-circulation assembly 50 in a liquid state. Moreover, the coolant, after having absorbed heat from the CPU 5 and potentially evaporating, should have a place to release the stored thermal energy. This place is the heat rejection unit 20. The heat rejection unit 20 expels the coolant's gained thermal energy from the spray cooling process out of the system, and the coolant should ideally return to ambient temperature. This also brings any vaporized coolant back to its liquid state. The thermal energy is typically expelled to the immediate environment by passing through a system with a large surface area that is being convectively cooled. In two-phase cooling, the heat rejection unit would typically take the form of a condenser. In single-phase cooling, the heat rejection unit would typically take the form of a radiator.

According to an embodiment, the heat rejection unit 20 comprises a set of serpentines, or any other thermally-conductive material shaped so as to offer a large area of contact with the surroundings where heat can be rejected. In the heat rejection unit 20, the coolant is allowed to release its thermal energy and condense back to its liquid state, with a lower temperature.

Therefore, in the close-loop configuration, the coolant is stored in a reservoir 30 in a liquid state, and pumped by a pump 40 into the spray chamber 10, where heat is absorbed from the CPU 5. When the coolant exits from the spray chamber 10, it is brought into the heat rejection unit 20, where the coolant releases the heat it absorbed and returns to the liquid state. A coolant-circulation assembly 50 is used to transport the coolant between each component of the cooling system 100.

According to an embodiment, the CPU 5 includes surface enhancement of the exposed cooling surface in order to improve heat transfer of the spray cooling.

According to another embodiment, a thermal conditioning unit (not shown) is added to the cooling system 100. The thermal conditioning unit can be placed either after the pump 40 or just before the pump 40. The thermal conditioning unit modifies the temperature of the coolant prior to it being sprayed. In single-phase spray cooling, it is typically used to subcool the coolant to temperatures potentially below the ambient temperature to improve heat transfer. In two-phase spray cooling, it is typically used to preheat the coolant to a temperature closer to the saturation temperature of the coolant. It has been shown that this can improve heat transfer in two-phase spray cooling because the coolant can vaporize more quickly when it impinges on the surface to be cooled. The thermal conditioning unit can take many forms. One example is a Peltier-style device.

Furthermore, an additional pump (not shown) can be provided at the outlet of the spray chamber 10. This additional pump would have two functions: preventing any build-up of coolant at the spray chamber outlet 18 and potentially moving coolant upwards against gravity towards the heat rejection unit 20. This would mainly be useful in the single-phase spray cooling inverted case.

Figure 2:
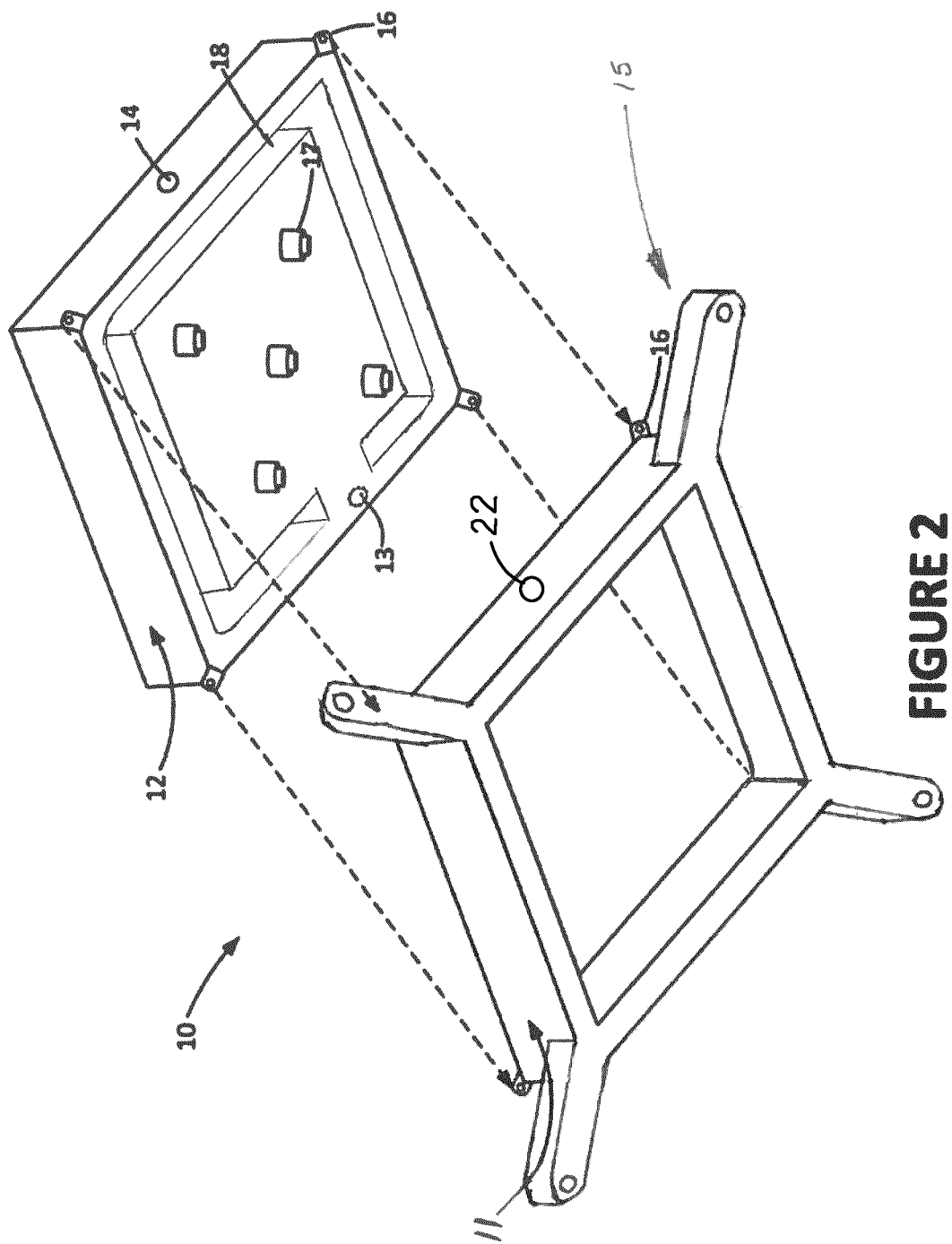
FIG. 2 is an exploded perspective view of a spray chamber, according to an embodiment.

Now referring to FIG. 2, there are shown the details of the two-part spray chamber 10.

The spray chamber 10 comprises an enclosure made up of spray chamber walls 11 and a spray chamber lid 12 which, together, define a hollow enclosure having a bottom opening, i.e., the spray chamber 10. The walls 11 together form a wall assembly defining an enclosure with a top opening and a bottom opening; the lid 12 covers the top opening of the wall assembly in a sealable manner. Providing the spray chamber 10 as a two-part device helps in cleaning and maintaining the system since the spray chamber 10 can be split in two separate parts. Furthermore, the spray chamber lid 12 can be removed while keeping the spray chamber walls 11 attached to the CPU. This will allow the safe removal of any remaining coolant on the CPU without the coolant having a chance to leak onto the rest of the computer system.

Lastly, the modular design of the spray chamber lid 12 allows new lids with (a) different spray nozzle(s) 17, with different spray nozzle array patterns, or with different inlet and outlet locations to be easily interchanged into the spray chamber 10.

According to an embodiment, the spray chamber lid 12 could have either a single spray nozzle or different array and number of spray nozzles. The nozzles 17 can also be oriented at different angles, individually or as a group. Furthermore, spray nozzle 17 refers to all types of spray nozzles.

The enclosure made up by the walls 11 is to be mounted on the exposed cooling surface of the CPU 5 in a sealable manner. Most of the CPU 5 will thus lie inside or directly under the chamber defined within the walls 11, and its cooling surface is exposed to the coolant that impinges on it.

Since the spray chamber 10 comprises side walls 11 and a lid 12, the spray chamber 10 is open at its bottom. Any fluid that would be inside the spray chamber 10 would thus be in fluid communication with whatever lies inside or directly under the spray chamber 10. Therefore, when the spray chamber 10 is mounted on a CPU 5, any fluid inside the spray chamber 10 is in direct contact with the exposed cooling surface of the CPU 5.

Even though, according to an embodiment, the spray chamber 10 comprises two distinct and separate parts, they need to be fastened together in order to work. The spray chamber lid 12 is fastened on the spray chamber walls 11, as suggested by the dotted arrows of FIG. 2, via a lid fastening system 16. Any fastener that can firmly hold together the chamber lid 12 on the spray chamber walls 11 can be used in the lid fastening system 16, e.g., screws, pins, hooks, etc.

Once the spray chamber lid 12 is fastened on the spray chamber walls 11, the spray chamber 10 needs to be fastened to the board. A board fastening system 15 is provided. Again, any suitable fastening means can be used, such as screws, pins, hooks, etc. According to an embodiment, the board fastening system 15 comprises arms at each corner of the spray chamber walls 11 (shown in FIG. 2) that can be bolted or screwed (i.e., attached in some way) to the heatsink mounting mechanism of the board (shown in FIG. 1). The heatsink mounting mechanism is typically part of the ILM of the CPU socket 7, which is built into the board. Specifically, the mounting mechanism typically comprises four screw holes in a standard pattern.

The modular design of the spray chamber walls 11 allows different walls that are compatible with the heat sink mounting mechanisms of other CPU sockets to be used without requiring any modification to the more complex spray chamber lid 12. This is advantageous when compared to most processor spray cooling prior art technologies which are designed in such a way that they must be built into the computer system/motherboard/CPU socket/CPU or require significant modification to an existing system in order to be used. The presently described design offers the advantage of being able to be used right away in existing computer systems (i.e., it can replace the current CPU cooling system/heat sink in current computer systems). No modifications need to be made to the CPU, the CPU's socket, or the motherboard. It provides a fastening system 15 that is compatible with certain CPU socket types. This fastening system 15 can be configured to be compatible with pretty much any CPU socket type by changing the fastening arms of the spray chamber wall. According to an embodiment, the fastening system is compatible with standard ILM heatsink mounting systems such as one of: a square ILM (80×80 mm mounting hole pattern for example), or a narrow ILM (56×94 mm mounting hole pattern for example).

The board fastening system 15 should provide a firm fastening so that the junction between the bottom of the spray chamber walls 11 and the CPU 5 forms a hermetic seal. The fluid inside the spray chamber 10 shall cool the CPU 5 but not escape from the spray chamber 10 to the surroundings. The same applies to the junction between the spray chamber lid 12 and the spray chamber walls 11.

According to an embodiment, the spray chamber lid 12 is itself hollow (not shown); it has a reservoir therein where the inlet coolant can accumulate. Coolant first enters the spray chamber lid 12 from the lid inlet 13, which communicates with the pump 40. Upon inflow of coolant into the spray chamber lid 12, the coolant accumulates and pressurizes therein (in the lid reservoir) under the effect of the pump 40 and is forced to flow through the nozzles 17.

According to another embodiment, the chamber lid 12 comprises channels or tubing therein to transport the coolant from the lid inlet 13 to the nozzles 17 rather than a reservoir. When the coolant flows through the nozzles 17, it is propelled into the spray chamber 10 in the form of droplets. These droplets of coolant are projected onto the exposed cooling surface of the CPU 5 at the open bottom of the spray chamber 10. According to another embodiment, there is only one spray nozzle.

Since the exposed cooling surface of the CPU 5 is very hot when the CPU 5 is working, the droplets of coolant that impinge on the CPU 5 rapidly heat up and, in the case of two-phase cooling, vaporize while absorbing the thermal energy from the electronic components of the CPU 5.

The coolant is channeled to the outer perimeter of the spray chamber lid 12 around the inlet reservoir, where it is allowed to outflow through the outlet 14 (via chamber outlet 18), shown in FIG. 2, in order to reach the heat rejection unit 20 thereafter. It is understood that the location of the lid inlet 13 and outlet 14 can be modified. For example, they could be located on top of the spray chamber lid 12.

Another embodiment of the design would include quick-disconnect fittings (not shown) at the inlet 13 and outlet 14 connections of the spray chamber lid 12. These would allow the spray chamber lid 12 to be easily disconnected from the tubing 50. Therefore, the spray chamber lid 12 could be easily disconnected from both the spray chamber walls 11 and its connected tubing 50, which would improve ease of maintenance, cleaning and customization.

The standard orientation of the system is to have the exposed cooling surface of the CPU 5 facing upward, and the spray chamber nozzles 17 spraying downwards to hit the CPU 5. However, another common orientation is to have the server motherboard upside down such that the exposed cooling surface of the CPU 5 is facing downward, and the spray chamber nozzles 17 would be spraying upwards to hit the CPU 5. This can be known as the inverted case. For the single-phase or the part single-phase, part two-phase spray cooling cases, this inversion typically becomes necessary because it allows the (excess) liquid coolant to flow downwards with the force of gravity towards the spray chamber outlet 18. Furthermore, it is possible to change orientation of the computer system so that the spray nozzles 17 are spraying in a direction that is at other non-standard angles to the vector of gravity.

In another embodiment, the chamber walls 11 may be provided with an outlet channel 22 to bring the coolant away from the spray chamber 10.

According to another embodiment, the spray chamber lid 12 and the spray chamber walls 11 are made from a single block that forms the spray chamber 10; that is, the spray chamber lid 12 and the spray chamber walls 11 are not, in this other embodiment, two distinct and separate parts.

According to another embodiment, the pressure in the spray chamber 10 can be modified. In one typical embodiment, a port (not shown) is added to either the reservoir 30 or spray chamber 10 so that a vacuum pump would be applied thereto in order to remove non-condensable gas or coolant vapor from the system and change the pressure.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. A spray chamber for cooling a computer processor on a circuit board, the spray chamber comprising:
   a wall assembly for sealable mounting directly on an exposed cooling surface of the computer processor defining an enclosure having a top opening and a bottom opening which opens on the exposed cooling surface of the computer processor, the wall assembly having a board fastening system adapted to removably fasten to the circuit board and to form a hermetic seal between the spray chamber and the exposed cooling surface of the computer processor, wherein the board fastening system comprises mounting arms that are compatible with a standard heatsink mounting mechanism of the circuit board; and
   a lid for covering the top opening of the wall assembly in a sealable manner, the lid being removable and having a nozzle which sprays coolant that impinges on the exposed cooling surface of the computer processor, the wall assembly and the lid being distinct and separate parts which together form the spray chamber.

2. The spray chamber of claim 1, wherein the heatsink mounting mechanism comprises a standardized screw hole pattern which is a part of an Independent Loading Mechanism (ILM) thereby the mounting arms are compatible with the ILM.

3. The spray chamber of claim 2, wherein the circuit board comprises a central processing unit socket that comprises the ILM.

4. The spray chamber of claim 1, further comprising a lid fastening system adapted to fasten and to form a hermetic seal between the wall assembly and the lid.

5. The spray chamber of claim 1, wherein the nozzle comprises more than one nozzle arranged according to an array pattern.

6. The spray chamber of claim 1, further comprising an inlet adapted to receive the coolant and a chamber outlet adapted to allow outflow of the coolant from the spray chamber.

7. The spray chamber of claim 6, wherein the inlet and the outlet are located in the lid.

8. The spray chamber of claim 6, wherein the outlet is located in the wall assembly.

9. A cooling system for cooling a computer processor on a circuit board, the cooling system comprising:
   a pump for pumping a coolant;
   a heat rejection unit where the coolant can release heat;
   a spray chamber comprising a wall assembly for sealable mounting on an exposed cooling surface of the computer processor and a lid for covering a top opening of the wall assembly in a sealable manner, the wall assembly and the lid being distinct and separate parts which together define the spray chamber for mounting directly on the exposed cooling surface of the computer processor and enclosing the exposed cooling surface of the computer processor, the wall assembly having a board fastening system adapted to removably fasten to the circuit board and to form a hermetic seal between the spray chamber and the exposed cooling surface of the computer processor, the board fastening system comprising mounting arms that are compatible with a standard heatsink mounting mechanism of the circuit board;

coolant-circulation assembly for transporting the coolant through the pump, the spray chamber and the heat rejection unit, the coolant-circulation assembly, the pump, the spray chamber and the heat rejection unit forming a closed-loop for transporting the coolant; and a reservoir for holding the coolant, the reservoir being integrated in the closed-loop;

wherein:

the spray chamber is adapted for spraying the coolant on the exposed cooling surface of the computer processor;

the wall assembly defines an enclosure having the top opening and a bottom opening which opens on the exposed cooling surface of the computer processor; and the lid is removable and has a nozzle which sprays the coolant that impinges on the exposed cooling surface of the computer processor.

10. The cooling system of claim 9, wherein the lid further comprises a lid reservoir where the coolant is accumulated and pressurized by the pump.

11. The cooling system of claim 9, wherein the heatsink mounting mechanism comprises a standardized screw hole pattern which is a part of the Independent Loading Mechanism (ILM) thereby the mounting arms are compatible with the ILM.

12. The cooling system of claim 11, wherein the circuit board comprises a central processing unit socket that comprises the ILM.

13. A method for cooling a computer processor on a circuit board, the method comprising:

sealably mounting a wall assembly with a board fastening system directly on an exposed cooling surface of the computer processor, defining an enclosure having a top opening and a bottom opening which opens on the exposed cooling surface of the computer processor, the board fastening system being adapted to removably fasten to the circuit board and to form a hermetic seal between the enclosure and the exposed cooling surface of the computer processor, the board fastening system comprising mounting arms that are compatible with a standard heatsink mounting mechanism of the circuit board;

sealably mounting a lid, distinct and separate from the wall assembly, for covering the top opening of the wall assembly, the lid being removable and having a nozzle; and with the nozzle, spraying coolant that impinges on the exposed cooling surface of the computer processor.

\* \* \* \* \*